(12) United States Patent  
Nielson et al.

(10) Patent No.: US 8,674,689 B1  
(45) Date of Patent: Mar. 18, 2014

(54) OPTICALLY TRANSDUCED MEMS MAGNETOMETER

(75) Inventors: Gregory N. Nielson, Albuquerque, NM (US); Eric Langlois, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 240 days.

(21) Appl. No.: 13/326,139

(22) Filed: Dec. 14, 2011

(51) Int. Cl.
   *G01R 33/02* (2006.01)
(52) U.S. Cl.
   USPC ......................................... 324/244.1
(58) Field of Classification Search
   USPC .............. 324/244–249, 761.01–761.1, 244.1, 324/750.01–750.3; 257/48; 438/14–18
   See application file for complete search history.

(56) References Cited

U.S. PATENT DOCUMENTS

| | | | |
|---|---|---|---|
| 5,493,223 A * | 2/1996 | Leger | 324/304 |
| 6,628,392 B2 | 9/2003 | Kuroda et al. | |
| 7,173,764 B2 | 2/2007 | Carr et al. | |
| 7,339,738 B1 | 3/2008 | Carr et al. | |
| 7,394,245 B2 * | 7/2008 | Brunson et al. | 324/244 |

OTHER PUBLICATIONS

"In-plane Nano-G accelerometer based on optical resonant detection system," by Krishnamoorthy et al. from Sandia National Laboratories, dated 2006, 2 pages.

* cited by examiner

*Primary Examiner* — Tung X Nguyen  
(74) *Attorney, Agent, or Firm* — Helen S. Baca

(57) ABSTRACT

MEMS magnetometers with optically transduced resonator displacement are described herein. Improved sensitivity, crosstalk reduction, and extended dynamic range may be achieved with devices including a deflectable resonator suspended from the support, a first grating extending from the support and disposed over the resonator, a pair of drive electrodes to drive an alternating current through the resonator, and a second grating in the resonator overlapping the first grating to form a multi-layer grating having apertures that vary dimensionally in response to deflection occurring as the resonator mechanically resonates in a plane parallel to the first grating in the presence of a magnetic field as a function of the Lorentz force resulting from the alternating current. A plurality of such multi-layer gratings may be disposed across a length of the resonator to provide greater dynamic range and/or accommodate fabrication tolerances.

20 Claims, 10 Drawing Sheets

OPTICALLY TRANSDUCED MEMS MAGNETOMETER

GOVERNMENT INTERESTS

Embodiments of the invention were developed under Contract No. DE-AC04-94AL85000 between Sandia Corporation and the U.S. Department of Energy. The United States Government has certain rights in this invention.

RELATED APPLICATIONS

This application is related to U.S. patent application Ser. No. 13/325,683, entitled OPTICALLY TRANSDUCED MEMS GYRO DEVICE, to Nielson, et al., filed even date herewith, the entirety of which is incorporated herein by reference for all purposes.

TECHNICAL FIELD

The present invention generally relates to Micro Electro-Mechanical System (MEMS) sensors, and more particularly to Lorentz force magnetometers.

BACKGROUND

Many conventional MEMS force and inertial sensors, such as accelerometers, magnetometers, and magnetometers, etc. include a pair of drive electrodes to which an alternating current (AC) is applied to induce a mechanical resonance in a suspended member.

In Lorentz force magnetometers, the alternating current is of a frequency tuned to induce mechanical deformation of the suspended member in a desired resonance mode by passing current through the suspended resonator so that, in the presence of a magnetic field, Lorentz forces form in the resonator inducing the resonator to mechanically deform. A number of techniques have been applied to sense the extent of deformation induced by the Lorentz forces and thereby measure the magnetic field strength. For example, deformation of the resonator is often sensed by capacitive coupling between resonator and the support, as measured by either primary drive electrodes or secondary sensing electrodes. Piezoelectric techniques have also been utilized, for example, by sensing mechanical deformation of the resonator with a piezoelectric material embedded in a resonator.

However, the conventional sensing techniques suffer from cross-talk and inherent sensitivity and other limitations. Both capacitive and piezoelectric techniques may also lack dynamic range such that many separate devices are required to conduct field measurements within different magnetic environments or where field strength varies widely and/or rapidly over time. Accordingly, there remains a need for MEMS Lorentz magnetometers that are more sensitive and/or have greater dynamic range.

SUMMARY OF THE DESCRIPTION

Embodiments of the present invention include MEMS magnetometers with optically transduced resonator displacement. Improved sensitivity, crosstalk reduction, and extended dynamic range may be achieved with devices having a deflectable resonator suspended from a support, a first grating extending from the support and disposed over the resonator, a pair of drive electrodes to pass an alternating current through the resonator, and a second grating in the resonator overlapping the first grating to form a multi-layer grating having apertures that vary dimensionally in response to deflection occurring as the resonator mechanically resonates in a plane parallel to the first grating in the presence of a magnetic field as a function of the Lorentz force.

In embodiments, a plurality of multi-layer gratings may be disposed across a length of the resonator to provide greater dynamic range and/or accommodate fabrication tolerances. In certain embodiments, phase between first and second gratings of each multi-layer grating in the plurality is varied to account for fabrication variation and ensure at least one multi-layer grating provides a threshold level of light intensity modulation with resonator displacement. In certain other embodiments, multi-layer gratings are disposed at locations of the resonator which experience different degrees of deflection, enabling a large dynamic range of magnetic field strength to be optically transduced via light intensity modulation satisfying predetermined threshold criteria.

In embodiments, a resonator has a bulk substrate thickness substantially equal to that of the support for increased dimensional mass, increased out-of-plane rigidity, and increased conductive cross-section at anchor points. In certain such embodiments, separate crystalline layers of a silicon-on-insulator (SOI) substrate are electrically connected with conductive vias through the insulator layer to form conductive anchors through an entire thickness of the support substrate.

In embodiments, methods of sensing a magnetic field include placing embodiments of the MEMS magnetometer described herein in a magnetic field and measuring the amplitude, or another displacement characteristic of resonance induced in the resonator, in response to the Lorentz effect of alternating current tuned to a resonant frequency of the resonator passing through the resonator. In certain such embodiments, light sources interrogate the multi-level gratings with a wavelength of light that is greater than grating feature dimensions (e.g., spaces or line elements) and intensity modulation of zeroth orders reflected or transmitted through the grating are sensed with a photosensitive device. Intensity variations are output for determination of magnetic field strength.

BRIEF DESCRIPTION OF THE DRAWINGS

Embodiments of the present invention are illustrated by way of example, and not limitation, in the figures of the accompanying drawings in which.

DETAILED DESCRIPTION

In the following description of optically transduced MEMS magnetometers, numerous details are set forth, however, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" means that a particular feature, structure, function, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the two embodiments are not mutually exclusive.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" my be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one material layer with respect to other layers. As such, for example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in contact with that second layer.

Figure 1A:
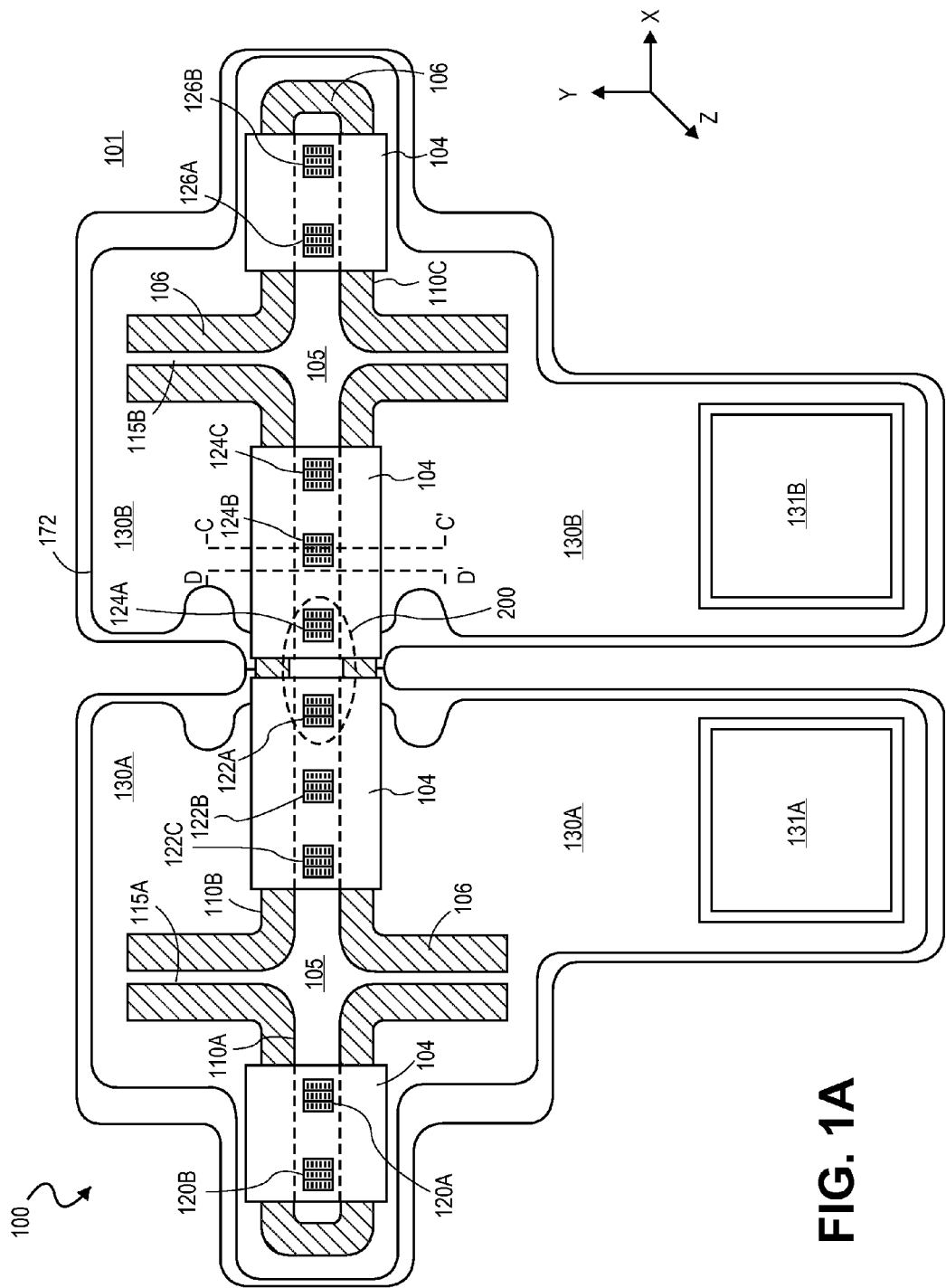
FIGS. 1A and 1B illustrate plan views of an optically transduced MEMS magnetometer, in accordance with an embodiment of the invention.
Figure 1B:
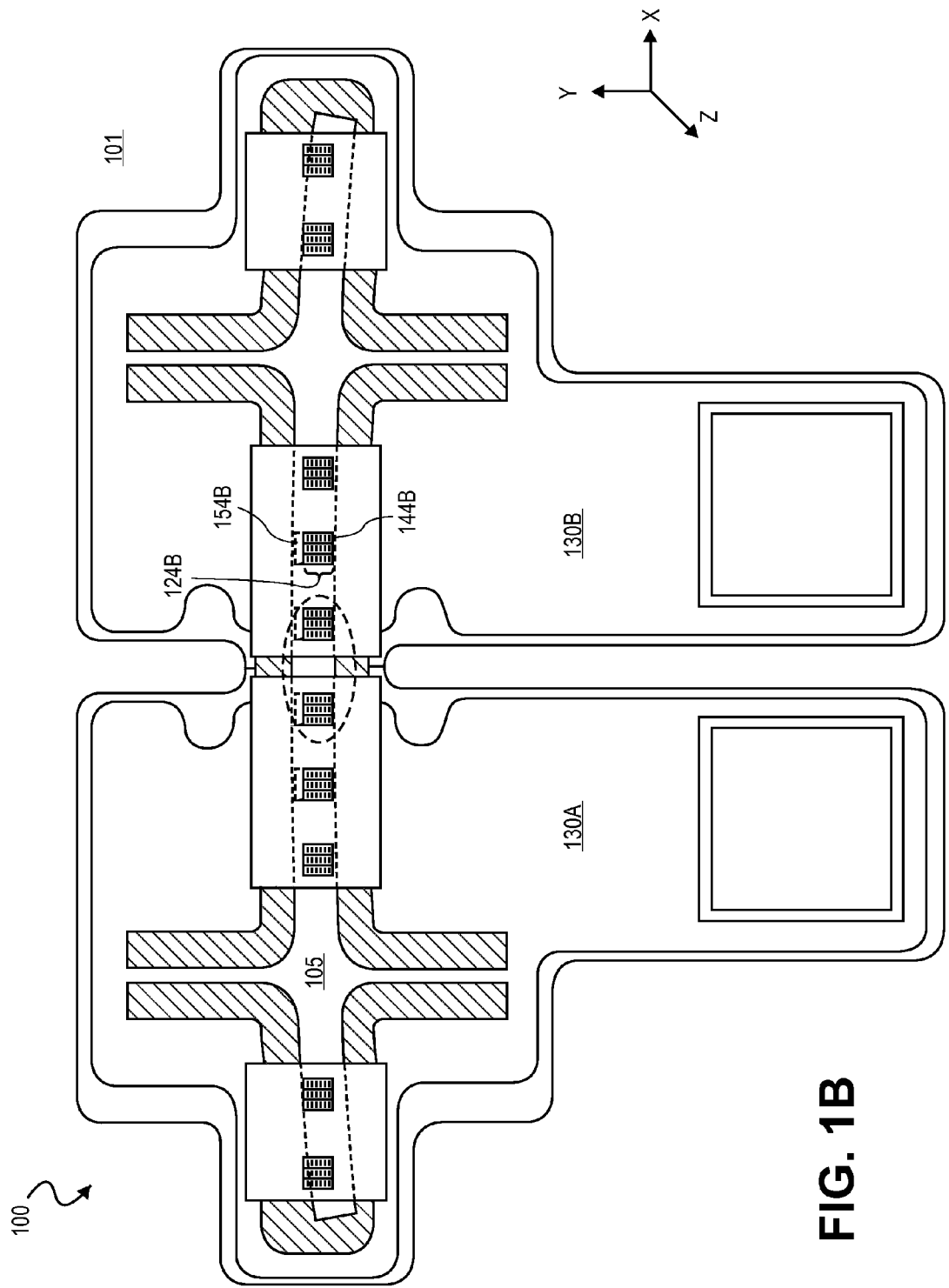
Figure 1C:
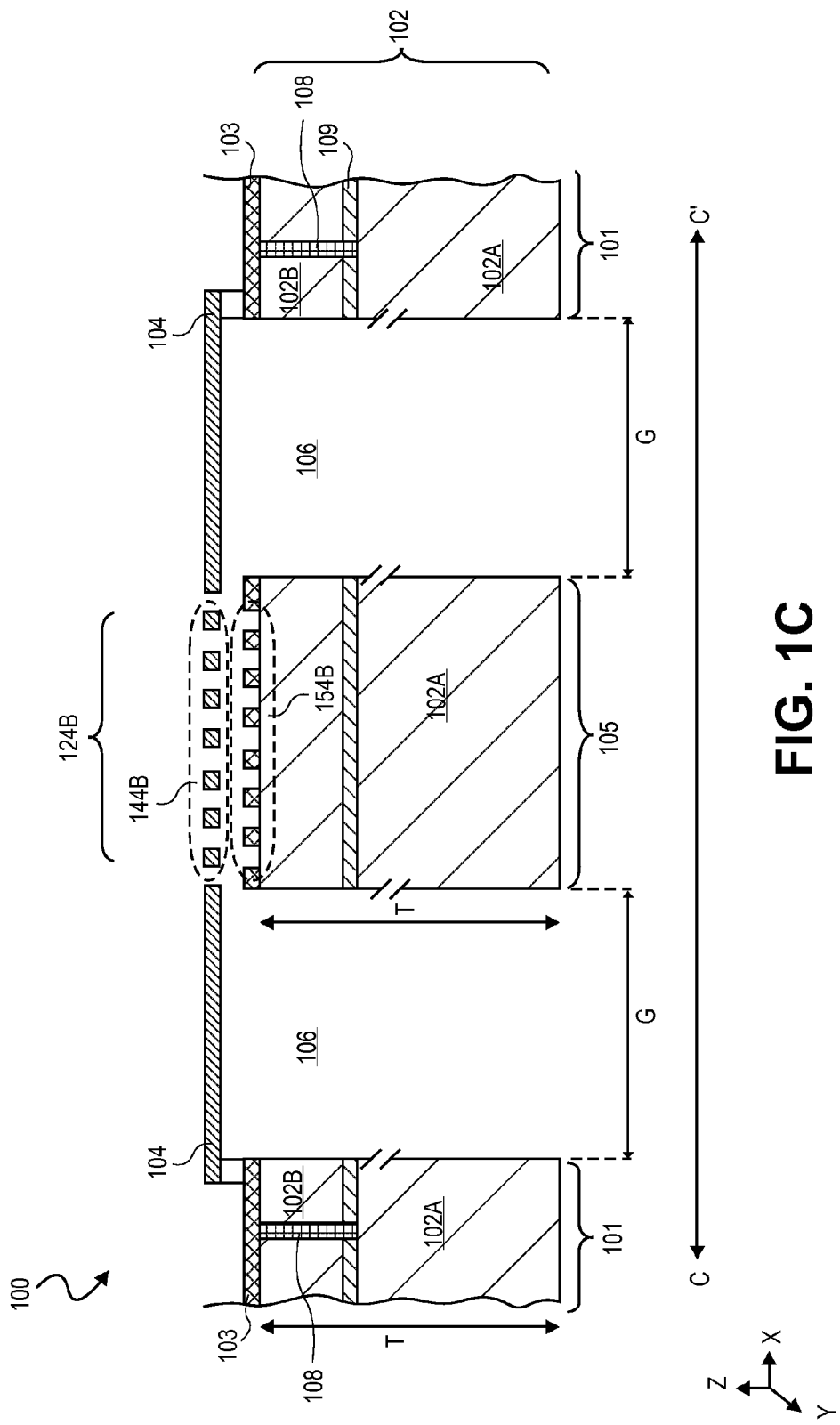
FIGS. 1C and 1D illustrate cross-sectional views of the optically transduced MEMS magnetometer illustrated in FIG. 1A, in accordance with an embodiment.
Figure 1D:
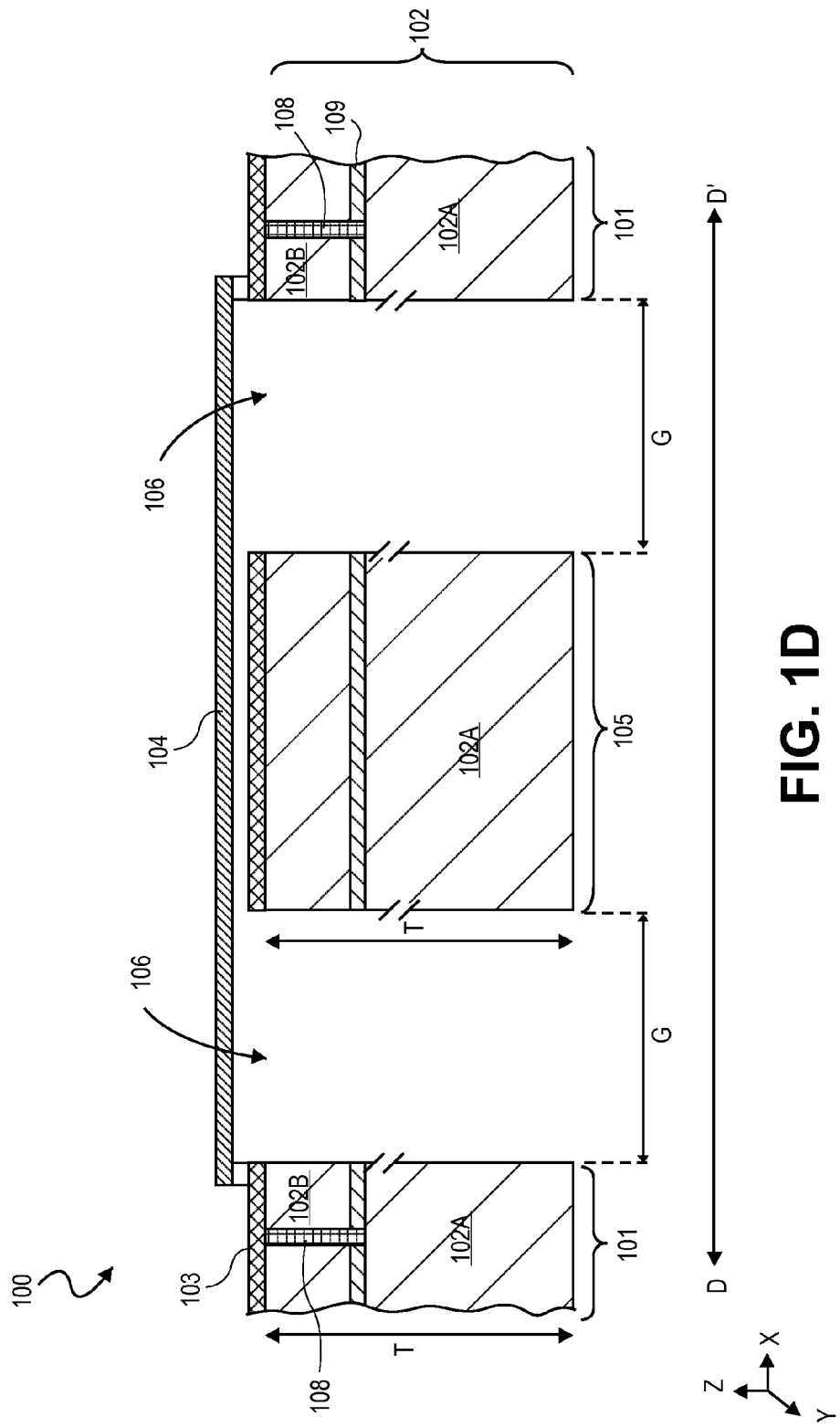

FIGS. 1A and 1B illustrate plan views of an optically transduced MEMS magnetometer, in accordance with an embodiment of the invention. FIGS. 1C and 1D illustrate cross-sectional views of the MEMS magnetometer 100 along the C-C' and D-D' lines illustrated in FIG. 1A, respectively.

As illustrated in FIG. 1A, the MEMS magnetometer 100 includes at least one deformable diffractive optical structure (e.g., a multi-layer grating 124A) disposed on a top side (or alternatively a bottom side) of the MEMS magnetometer 100 for optical domain transduction of the resonator displacement. Transduction in the optical domain enables greater sensitivity than conventional techniques and also enables the resonator to be bulk machined which enables the MEMS magnetometer 100 to be fabricated simultaneously with the bulk micromachined gyroscope described in the above referenced U.S. Patent Application, entitled OPTICALLY TRANSDUCED MEMS GYRO DEVICE, to Nielson, et al. A multi-axis inertial sensor of superior performance may be provided with both inertial and magnetic sensing functions provided by multiple such optically transduced MEMS devices monolithically integrated on a same substrate. As such, in certain advantageous embodiments, one or more of the MEMS magnetometers described herein are provided in combination with one or more bulk micromachined gyroscopes. Of further advantage, the crosstalk present when Lorentz force drive and capacitive or other electrical sensing is used together is not present when optical displacement sensing resulting from the deformable diffractive optical structures is used.

In embodiments, a MEMS magnetometer includes a support and at least one resonator suspended from the support. Examples of more than one resonator include a tuning fork magnetometer. It is understood that based on the illustrative single resonator embodiments provided herein, one of skill in the art may readily adapt a conventional thin film tuning fork magnetometer design, or other multi-mass magnetometer known in the art, to incorporate one or more of the techniques described herein, such as optical domain transduction, bulk machining, etc.

In the exemplary embodiment depicted in FIG. 1A, the support 101 forms a frame completely surrounding a resonator 105. As further shown in FIGS. 1C and 1D, both the support 101 and the resonator 105 have at least a bulk substrate thickness, T. As such, the resonator 105 and the support 101 have substantially the same thickness with minor thickness differences between the two arising from differences in the thin film processing over the substrate 102 for one or the other of the resonator 105 and the support 101. For example, one or more layers of thin film materials such as silicon dioxide, polysilicon, silicon nitride, electrode metallization, etc. utilized in the fabrication of the MEMS magnetometer 100 may be present to differing extents between the support 101 and the resonator 105.

Generally, the bulk substrate thickness, T may vary depending on convention for the material selected for the substrate 102 (FIG. 1C). While, the substrate 102 may generally be any material suitable for semiconductor device fabrication, in advantageous embodiments a bulk substrate composed of a poly or single crystalline material such as, but is not limited to, silicon, germanium, silicon-germanium, or a III-V compound semiconductor material is utilized. In embodiments, the substrate 102 has conductivity sufficient for a voltage applied for drive of the resonator to pass through the entire bulk substrate thickness T without detrimental voltage drop. For example, impurity doped substrates may be utilized, as known in the art. In a preferred embodiment, the substrate 102 is a semiconductor (silicon) on insulator (SOI) substrate having a buried insulator layer 109 (e.g., silicon dioxide) spanning the entire area of the substrate 102, as known in the art. For such embodiments, the bulk substrate thickness T includes both a base semiconductor substrate portion 102A disposed below the buried insulator layer 109, and also an overlying semiconductor substrate portion 102B. Generally, the bulk substrate thickness, T is to be at least 500 µm. In a preferred embodiment where the substrate material is silicon (e.g., a single crystal silicon wafer), the bulk substrate thickness, T will be approximately 700 µm (i.e. between about 650 µm and about 750 µm).

As further shown in FIG. 1A, delineation of the resonator 105 from the support 101 is by the trench 106 that is nearly continuous with the only discontinuities occurring at anchor points (e.g., anchors 115A and 115B). As further shown in FIGS. 1B and 1C, the trench 106 has a lateral gap dimension, G, defining the critical dimension and aspect ratio of the trench 106. As the trench 106 passes completely through the substrate 102, the trench 106 is at least 500 µm deep (e.g., as measured from a bottom side of the substrate 102) and approximately 700 µm deep for the exemplary silicon substrate embodiments. Because the lateral gap dimension, G, does not limit device displacement transduction sensitivity, the dimension may be whatever is sufficient for the amount of resonator displacement induced during resonance and/or otherwise needed for a given deep trench etch process. Generally, the lateral gap dimension, G, is microns wide. In exemplary silicon substrate embodiments, the lateral gap dimension, G, is between 20 μm and 60 μm for an aspect ratio between about 20:1 and 30:1, which is readily attainable using conventional anisotropic silicon etching techniques known in the art.

While a resonator may generally have any shape, in the exemplary embodiment illustrated in FIG. 1A, the resonator 105 is a beam having a longitudinal beam length extending along a first dimension (e.g., x-dimension in FIG. 1A). The bulk substrate thickness, T, is therefore orthogonal to the longitudinal beam length, extending out-of-plane (e.g., in the z-dimension) and a transverse beam length is along the y-dimension. As such, the trench 106 defines faces of the resonator which extend in the z-dimension through the bulk substrate thickness. Separated from the resonator face 110A by the trench 106 are opposing support faces 110B and 110C which each form a portion of electrically independent drive electrodes 130A, 130B. The drive electrodes 130A, 130B are isolated from surrounding regions of the support 101 by isolation 172 wrapping around the MEMS magnetometer 100 and are to be powered by an AC signal applied via pads 131A, 131B, respectively. Each of the two anchor points 115A and 115B are electrically coupled to the corresponding ones of the electrodes 130A, 130B and conduct current to opposite end portions of the resonator 105. For the preferred SOI embodiments, current conduction through the anchor points 115A, 115B is provided across the entire bulk substrate thickness T with conductive vias 108 passing through the buried insulator layer 109 to electrically couple the base semiconductor substrate portion 102A with the overlying semiconductor substrate portion 102B, as shown in FIGS. 1C and 1D.

In the exemplary embodiment illustrated in FIG. 1A, the first and second electrically independent support faces 110B and 110C diverge at a center of the resonator 105 (separated by isolation 172) and wrap continuously around the anchors 115A and 115B converge back at a center of the resonator on an opposite side of the resonator 105 (again separated from each other by isolation 172). With the electrodes 130A, 130B contacting both legs of each anchor 115A and 115B, current is spread across all four anchor legs. The legs of anchor 115A and 115B are ideally located in the vicinity of the nodal point of the desired resonant mode to reduce energy losses in the desired resonant mode of the mechanical resonator.

As further illustrated in FIG. 1B, the resonator 105, as attached to the support 101 at two anchor points, is to deflect along the longitudinal axis relative to the support 101 in response to an AC signal imparted by the drive electrodes 130A and 130B in the presence of a magnetic field. In the exemplary embodiment, the resonator 105 is to oscillate in the plane of the support 101 only (i.e., in an x-y plane) with oscillation modes out of the x-y plane (i.e., in the z-dimension) suppressed by the anchors 115A, 115B having a bulk thickness T (e.g., 700 μm) which is many times a critical dimension of the anchor in the x-dimension of approximately 50 μm. Further the resonant beam has an aspect ratio such that its thickness in the z-dimension is thicker than its width in the y-dimension that forces the desired in-plane resonant mode to be the lowest frequency mode. In the exemplary embodiment, in the presence of the magnetic field, current passing through a longitudinal length between the anchors 115A and 115B induces the longitudinal, in-plane deflection through the Lorentz effect. With the current applied at an AC frequency approximately equal to a resonant frequency of the resonator 105, the Lorentz force is amplified by the mechanical Q of the resonator 105. In a first embodiment, the resonator 105 resonates only in response to the Lorentz force being of sufficient magnitude (i.e., when in the presence of a sufficiently strong magnetic field). In a second embodiment, the driven AC signal alone induces the in-plane resonance with amplitude of the resonance then modulated by the Lorentz force.

In an embodiment, the deformable diffractive optical structure employed for optical transduction of resonator displacement is a multi-layer grating. In the exemplary embodiment, each grating (i.e., grating) in the multi-layer gratings 120A, 120B, 122A-122C, 124A-124C, and 126A, 120B is a sub-wavelength grating, however chirped gratings and other forms known in the art may also be employed. As shown in FIG. 1C, the multi-layer grating 124B includes a first grating 144B rigidly affixed to the support 101 and extending over the trench 160 to be disposed over a second grating 154B formed on the resonator 105. Each of the first and second gratings 144B and 154B may be formed in either the substrate 102, or as illustrated in FIG. 1C, in thin film layers 104, 103, respectively, which are formed on the substrate 102. In the exemplary embodiment, the first grating 144B is disposed in a material layer 104 that forms a bridge spanning the transverse length of the resonator 105. Exemplary thin film materials which can be used for layers 104 and 103 include silicon dioxide, silicon nitride and polysilicon, as well as any other material known in the art having adequate thermal stability and structural integrity for the geometries and functions described herein.

As further illustrated in FIG. 1B, aperture dimensions of a multi-layer grating is to vary with the displacement of the second grating 154B relative to the first grating 144B as the resonator deflects along its longitudinal length in the plane of resonance. While first-order gratings with feature dimensions significantly larger than a wavelength of light used for the optical transduction (i.e., the operating wavelength) may be used, near field multi-layer gratings are preferred as being capable of modulating the intensity and polarization of an incident light in response to much smaller displacements of the grating elements (i.e., lines and spaces). Near field multi-layer gratings having line elements of the gratings separated by distances which are less than the operating wavelength are known to modulate the intensity of reflected or transmitted zero orders even when displacement in-plane of the grating is only fractions of a wavelength. For a detailed description of such near field multi-layer gratings, the interested reader is referred to commonly assigned U.S. Pat. Nos. 7,173,764 and 7,339,738 to Carr et al., which are incorporated herein by reference in their entirety for all purposes. The sub-wavelength displacement sensitivity possible with the near field multi-layer grating enables a level of magnetic field sensitivity heretofore unknown.

In an embodiment, a MEMS magnetometer includes a plurality of near field multi-layer gratings. As shown in FIG. 1A, the plurality of multi-layer gratings 120, 122, 124, and 126 are disposed in a one dimensional array across the longitudinal beam length. In an embodiment, the plurality of multi-layer gratings is disposed symmetrically about a center of the resonator 105. In the exemplary embodiment illustrated in FIG. 1A, the plurality of multi-layer gratings is disposed symmetrically to have pairs of the multi-layer gratings disposed over points of equivalent deflection. For example, multi-layer grating pair 122A and 124A are disposed equidistant from a center of the longitudinal beam length (extending along x-axis if FIG. 1A). Similarly, multi-layer grating pairs 122B and 124B, 122C and 124C, 120A and 126A, 120B and 126B are similarly equidistant from the beam center, beam ends, and anchors 115A, 115B. An alternative symmetrical arrangement has a single multi-layer grating centered over the center of the longitudinal beam length.

Figure 2:
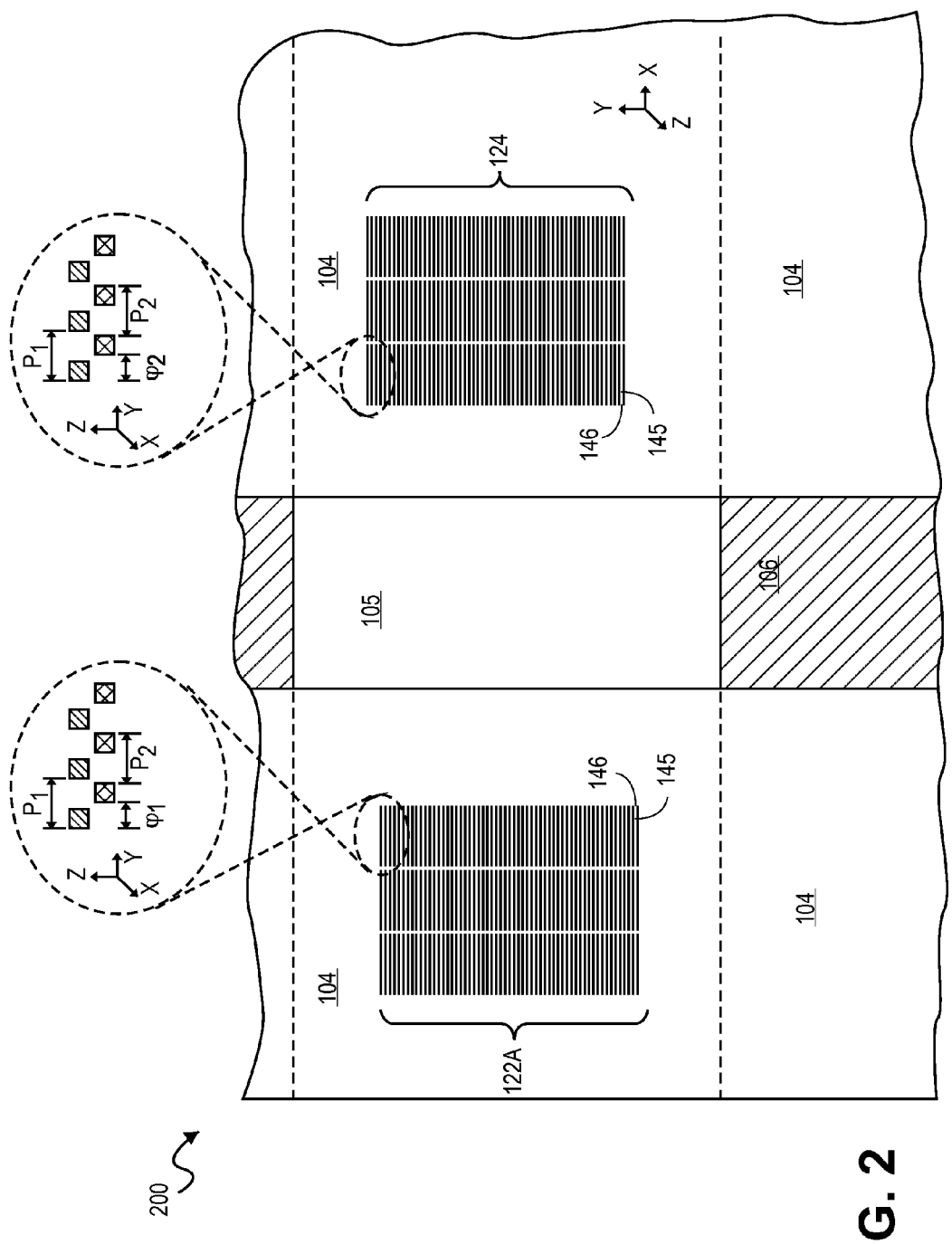
FIG. 2 illustrates an expanded plan view of a multi-layer grating in the optically transduced MEMs magnetometer illustrated in FIG. 1A, in accordance with an embodiment.

In an embodiment, across the plurality of arrayed multi-layer gratings, line elements in the gratings of each multi-layer grating have a same pitch, but an alignment offset between the gratings 144 and 154 is different across the plurality of multi-layer gratings so that phase between the overlapping gratings is modulated across the plurality of multi-layer gratings. FIG. 2 illustrates an expanded plan view 200 of a portion of the MEMS magnetometer 100. The expanded plan view 200 illustrates multi-layer gratings 122A and 124A. Inset within FIG. 2, cross-sectional views 222A illustrates line elements in the first grating 122A having a first pitch $P_1$, defining a period of the first grating 144A. Similarly, line elements in the second grating 154A have a second pitch $P_2$. The pitches $P_1$ and $P_2$ may be substantially equal to each other, but are not necessarily so. Alignment between the first and second gratings 144A and 154A defines a phase $\phi_1$ for the first multi-layer grating 122A.

In the cross-sectional view 224B inset within FIG. 2, line elements in the first grating 144A have the first pitch $P_1$. Similarly, line elements in the second grating 154A have the second pitch $P_2$. As such, between the two multi-layer gratings 122A and 124A, the pitches of respective gratings are equal. Alignment (i.e., overlay) between the first and second gratings of the multi-layer gratings 122A and 124A is however different such that a phase $\phi_2$ for the second multi-layer grating 124A is different from the phase $\phi_1$. In one exemplary embodiment, the difference in phase between adjacent ones of the arrayed gratings is 10-20 nm. In the preferred embodiment, phase is varied in equal steps from one end of the resonator to the other so that over the ten multi-layer gratings arrayed along the longitudinal beam length of the resonator 105, phase is varied by 80-150 nm to account for misalignment of the gratings forming each multi-layer grating that could reduce the intensity modulation with displacement. In another embodiment, phase is varied in equal steps from the center of the resonator to each end so that over two sets of five multi-layer gratings arrayed along the longitudinal beam length of the resonator 105, phase is varied by 40-75 nm. As such, multi-layer grating phase is the same at locations of equivalent degrees of deflection. In another embodiment however, the multi-layer grating phase $\phi$ is varied only within the grating pairs. For example, just as the multi-layer grating pairs 122A and 124A have differing phases $\phi_1$ and $\phi_2$, multi-layer grating pairs 122B and 124B have the same two differing phases $\phi_1$ and $\phi_2$, multi-layer grating pairs 122C and 124C also have the same two differing phases $\phi_1$ and $\phi_2$, and so do multi-layer grating pairs 120A, 126A, and 120B, 126B. As such, phase is varied across two locations having equivalent degrees of deflection permitting a phase selection and a degree of deflection to be independently selected.

Varying the multi-layer grating phase $\phi$ across an arrayed plurality of multi-layer gratings enables magnetic field sensing system incorporating the MEMS magnetometer 100 to undergo a functional test where multi-layer gratings in the array may be binned out to identify the grating having a phase, $\phi_n$, that satisfies a predetermined threshold criteria, e.g., a greatest displacement induced modulation of light intensity (e.g., zeroth order) or an intensity modulation level within a predetermined range. Variation in the fabrication process affecting the gratings may therefore be accounted for to advantageously improve measurement sensitivity. In an alternate embodiment, whether or not multi-layer grating phase is modulated across the plurality, more than one multi-level grating may be utilized for displacement transduction. For example, differential measurements may be performed and/ or a comb filter or other filtering may be applied to combine outputs from more than one multi-level grating in each array and remove common mode noise, etc. as known in the art of electrical signal conditioning.

As further depicted in the expanded plan view 200 in FIG. 2, apertures 145 and intervening line elements 146 are in an x-y plane parallel to the plane of the support, and to the plane of resonance. The major aperture lengths extend along the x-dimension and to define the first grating period along the y-dimension to transduce displacement resulting from the in-plane deflection along the longitudinal beam length. As shown in FIG. 1C, the second grating 154B comprises a similar plurality of regularly spaced line elements in a second plane parallel to the plane of the support 101, and plane of resonance, but separated in the z-dimension from the first line elements. This z-dimension separation between gratings may be less than a wavelength of light utilized for interrogation of the grating.

Figure 3A:
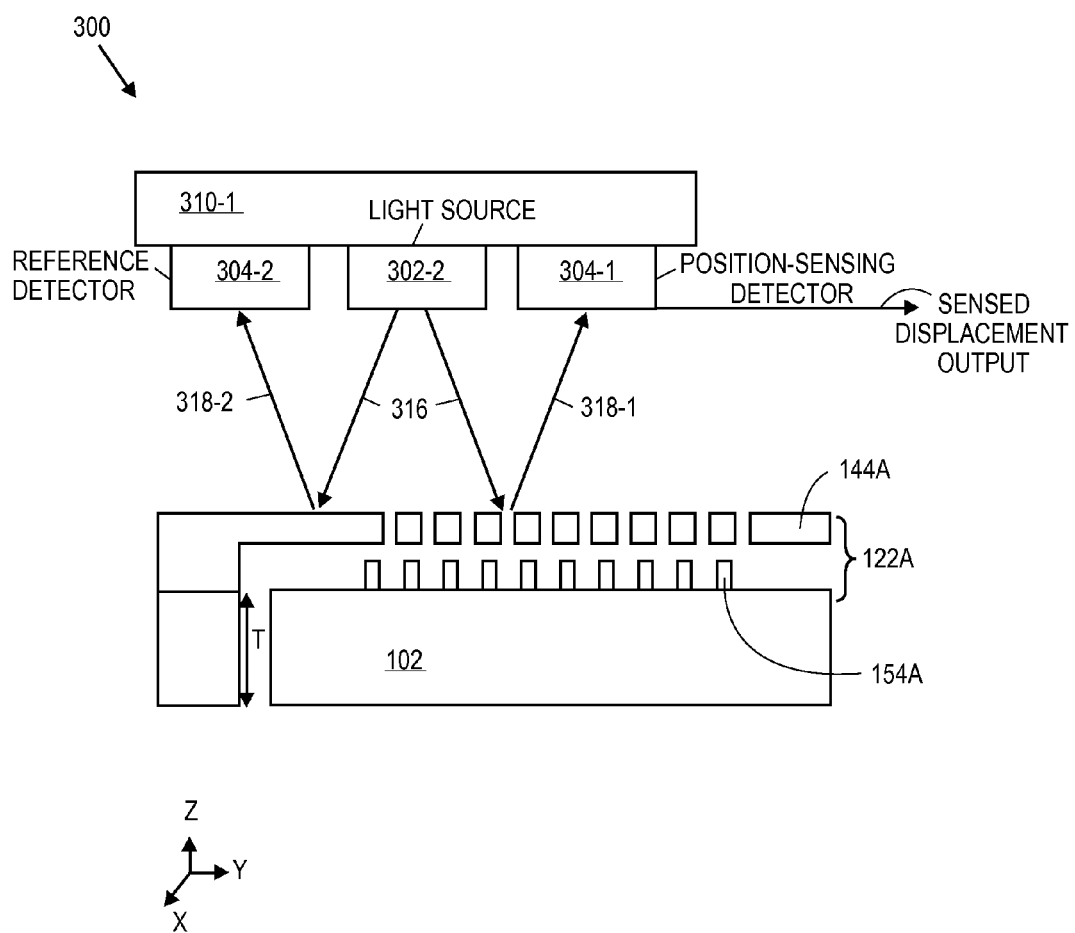
FIGS. 3A and 3B illustrate a system for sensing a magnetic field, in accordance with an embodiment.
Figure 3B:
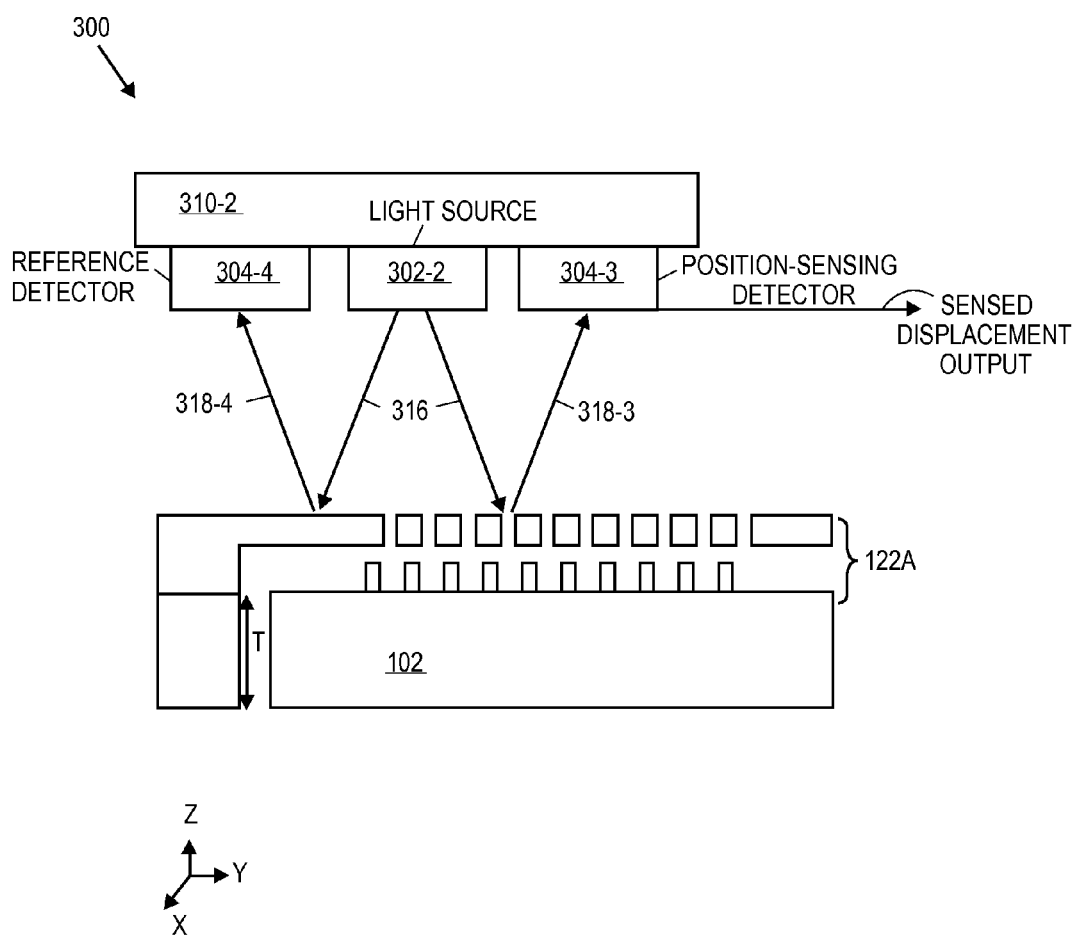

FIGS. 3A and 3B illustrate a magnetic field sensor 300 employing the MEMS magnetometer 100, in accordance with an embodiment. For the exemplary embodiment, the magnetic field sensor 300 utilizes the multi-layer grating 124A as a reflective grating, however a sensor employing a transmissive grating may be similarly designed (e.g., where both the first and second gratings 144A and 154A are cantilevered off their respective bulk structures). In the magnetic field sensor 300, a light source 302-1 is provided on a substrate 310-1 together with a pair of detectors 304. Exemplary light sources for interrogating the multi-layer grating 124A include a VCSEL or an LED.

For the exemplary linear grating, light having a specific wavelength (i.e., operating wavelength) is diffracted into modes that emerge along multiple discrete angles. For the preferred near field grating embodiments where the multi-layer gratings are "sub-wavelength," the light source 302 is to emit an incident light beam 316 at a wavelength that is greater than the pitch of the grating (either the first grating 144A or second grating 154A, although in the preferred embodiment where the both the first and second grating have the same pitch, the wavelength is grating than the pitch of both first and second gratings). The sub-wavelength grating has only a zeroth-order mode and a surface wave mode. When optically coupled, varying the offset between the two gratings allows for modulation of the light between transmission and reflection in the zeroth order mode.

Exemplary detectors 304 include a PIN photodiode, an active pixel sensor (APS), or the like. In one near field embodiment, the first photodetector 304-1 is to measure an intensity of zeroth-order light modulated by the multi-layer grating 124A, though other orders may also be sensed. The first detector 304-1 (i.e., a position sensing detector) is to detect the light portion 318-1 reflected off the multi-layer grating 124A. A second detector 304-2 (i.e., a reference detector) is to detect a light portion 318-2 of the light 16 reflected off a reference surface outside the multi-layer grating 124A (i.e., the reference light portion 318-2 bypasses the multi-layer grating 124A). The reference detector 304-2 provides an electrical output signal which can be combined with the electrical output signal of the detector 304-1 to substantially remove any common-mode noise (i.e., noise due to the light source or other factors which is common to both reflected light portions 318-1 and 318-2) and thereby improve a sensitivity for sensing relative displacement of the second grating 154A disposed on the resonator. In alternate embodiments of the present invention where a transmitted light portion is detected, a reference detector can be similarly used to detect a portion of the incident light beam 316 which bypasses the multi-layer grating 124A. Output from first detector 304-1 provides a first basis for outputting a displacement measure which is then translated downstream into a sensed magnetic field strength (gauss).

For the exemplary embodiments employing a plurality of multi-layer gratings, each multi-layer grating having a particular phase is paired with a light source 302 and at least one optical detector 304, for example an array of LEDs or VCSELs may be disposed over each array of multi-layer gratings. FIG. 3B illustrates a cross-section view of the magnetic field sensor 300 taken through a second multi-layer grating 122A on the substrate 102 disposed relative to a second light source 302-2 that is fabricated in a substrate 310-2, which may be the same substrate as 310-1, or a separate (third) substrate. First detector 304-3 and reference detector 304-4 operate in the same manner described for detectors 304-1 and 304-2 to detected light portions 318-3 and 318-4, respectively, with the position sensing output from first detector 304-3 being a second basis for outputting a sensed magnetic field strength. The intensity modulation generated by one from the plurality of multi-layer gratings, or intensity modulation generated by each multi-layer grating of the array may be collected simultaneously (in parallel) or serially sampled in a time divided (e.g., in round robin fashion) or other multiplexed manner.

Figure 4:
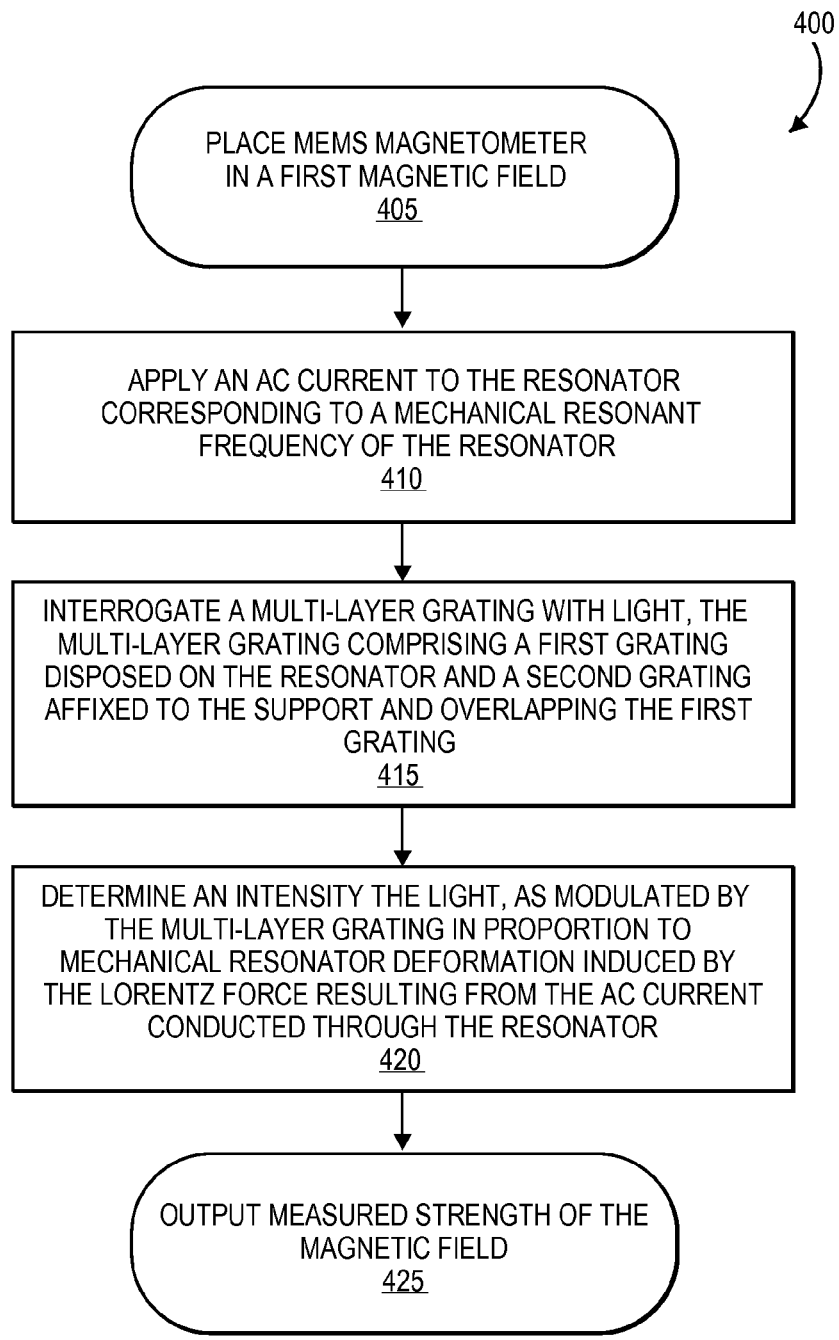
FIG. 4 is a flow diagram illustrating a method of sensing a magnetic field, in accordance with an embodiment of the invention.

FIG. 4 is a flow diagram illustrating a method 400 of sensing a magnetic field, in accordance with an embodiment of the invention. The method 400 may be performed with the magnetic field sensor 300 when in an operational mode. At operation 405, the MEMS magnetometer 100 is placed in a magnetic field. At operation 410, an AC current is applied to the resonator, the frequency of which is approximately a mechanical resonant frequency of the resonator. At operation 415, a multi-layer grating, such as multi-layer grating 122A, is interrogated with light, for example of a wavelength greater than a feature size of the multi-layer grating. At operation 420, the extent of resonator deflection is determined based on modulation of light intensity by the multi-layer grating in proportion to the Lorentz force resulting from the AC current conducted through the resonator in the presence of the magnetic field. At operation 425, a determination of the magnetic field strength is made based on the measured resonator deflection.

Figure 5:
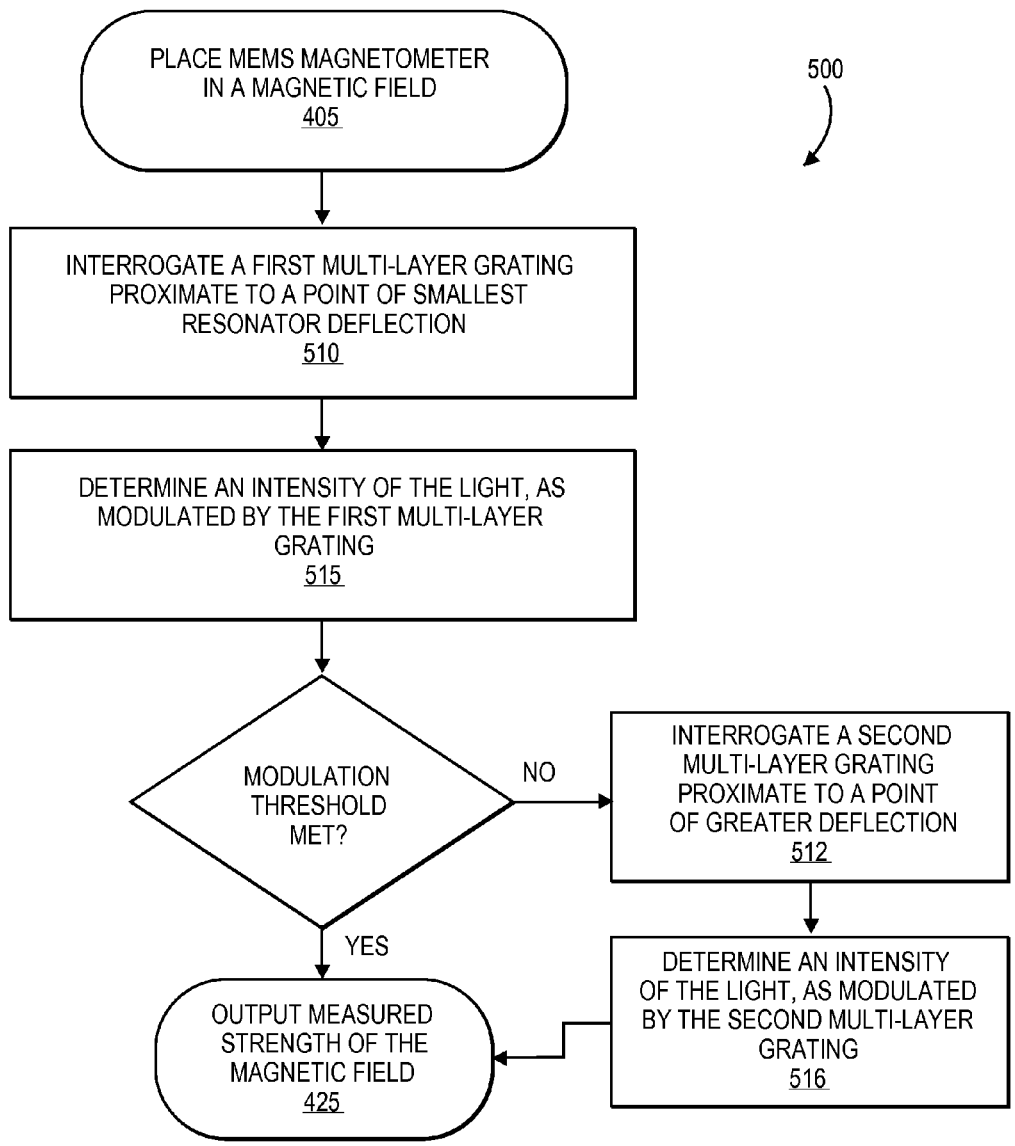
FIG. 5 is a flow diagram illustrating a method of operating a MEMS magnetometer having a plurality of multi-layer gratings, in accordance with an embodiment of the invention.

FIG. 5 is a flow diagram illustrating a method 500 of operating a MEMS magnetometer having a plurality of multi-layer gratings, in accordance with an embodiment of the invention. The method 500 may be performed with the magnetic field sensor 300 during an operational mode to select a multi-layer grating from a plurality of multi-layer gratings disposed at locations subject to different degrees of deflection so as to implement the method 400. Again beginning with operation 405, the MEMS magnetometer 100 is placed in a magnetic field. At operation 510, a first multi-layer grating associated with a first degree of resonator deflection, such as the smallest degree of deflection (e.g., multi-layer grating 122C in FIG. 1A), is interrogated. At operation 515, an intensity of an optical response (e.g., reflected zeroth order light), as modulated by the first multi-layer grating, is determined. If a predetermined intensity modulation threshold is met (e.g., sufficiently large), resonator displacement is transduced with the first multi-layer grating and output as the basis for determining the measured field strength at operation 425. If the predetermined intensity modulation threshold is not met, the method 500 proceeds to operation 512 where a second multi-layer grating proximate to a point of relatively greater degree of deflection is interrogated. At operation 516, an intensity of an optical response (e.g., reflected zeroth order light), as modulated by the second multi-layer grating, is determined and output as the basis for determining the measured field strength at operation 425. Method 500 may proceed to incrementally advance through every multi-layer grating in a plurality with each subsequently selected grating associated with a greater degree of resonator deflection until the multi-layer grating disposed at a point of maximum deflection is interrogated, at which point a measured response of maximum sensitivity is output.

Figure 6:
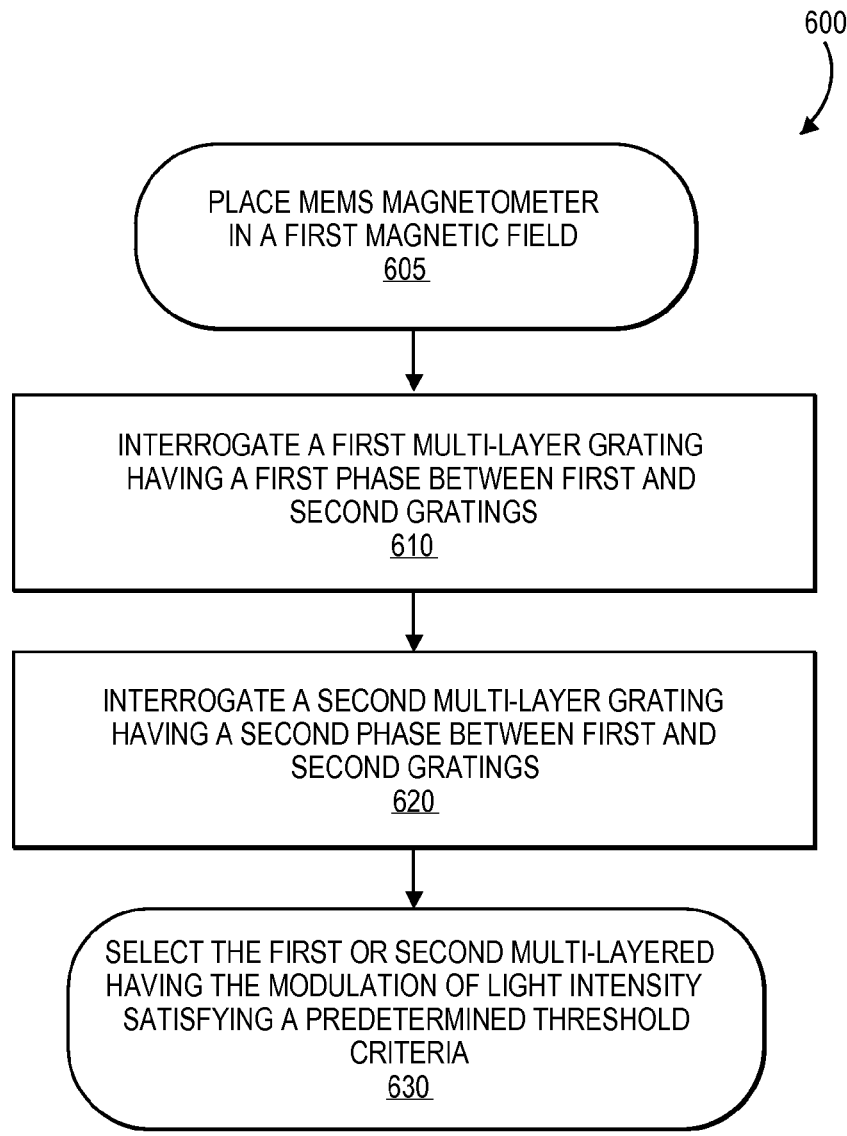
FIG. 6 is a flow diagram illustrating a method of operating a MEMS magnetometer having a plurality of multi-layer gratings, in accordance with an embodiment of the invention.

FIG. 6 is a flow diagram illustrating a method 600 of operating a MEMS magnetometer having a plurality of multi-layer gratings, in accordance with an embodiment of the invention. The method 600 may be performed with the magnetic field sensor 300 during as a functional test prior to entering an operational mode to select a multi-layer grating that will be used during an operational mode from a plurality of multi-layer gratings having different phases. At operation 605, the MEMS magnetometer 100 is placed in a magnetic field. At operation 610, a first multi-layer grating associated with a first phase between first and second gratings is interrogated with light. An intensity of an optical response (e.g., reflected zeroth order light), as modulated by the first multi-layer grating, is then determined. At operation 620, a second multi-layer grating having a second multi-layer grating phase, different than the first, is interrogated and an intensity of an optical response (e.g., reflected zeroth order light) assessed. At operation 630, the first or second multi-level grating is selected based on predetermined selection criteria. For example, the first or second multi-level grating satisfying a predetermined intensity modulation threshold is selected. Alternatively, the first or second grating having the greater intensity modulation is selected. The selected multi-layer grating along with the associated light source and detector are then identified for further use, for example as the exclusive displacement transducer output used in method 400.

It is to be understood that the above description is illustrative, and not restrictive. For example, while flow diagrams in the figures show a particular order of operations performed by certain embodiments of the invention, it should be understood that such order is not required (e.g., alternative embodiments may perform the operations in a different order, combine certain operations, overlap certain operations, etc.). Furthermore, many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. The scope of the invention should, therefore, be determined with reference to the appended claims, along with the full scope of equivalents to which such claims are entitled.

What is claimed is:

1. A MEMS device, comprising:
    a support including a substrate;
    a deflectable resonator suspended from the support;
    a first grating extending from the support and disposed over the resonator;
    a pair of drive electrodes to drive an alternating current through the resonator; and
    a second grating in the resonator, wherein the first and second gratings overlap to form a multi-layer grating having apertures that vary dimensionally in response to deflection in the resonator occurring as the resonator mechanically resonates in a plane parallel to the first grating in the presence of a magnetic field as a function of the Lorentz force induced by the alternating current.

2. The MEMS device of claim 1, wherein the multi-layer grating is one of a plurality of multi-layer gratings arrayed across a length of the resonator.

3. The MEMS device of claim 2, wherein ones of the multi-layer gratings are disposed at locations on the resonator that experience varying degrees of deflection induced by the Lorentz force to provide a wide dynamic range of sensitivity to the magnetic field.

4. The MEMS device of claim 2, wherein the first grating comprises a plurality of first regularly spaced line elements in a first plane parallel to the plane of resonance, wherein the second grating comprises a plurality of second line elements regularly spaced in a second plane parallel to the plane of resonance and separated from the first line elements in a third dimension out of the plane of resonance.

5. The MEMS device of claim 4, wherein the plurality of first line elements in each first grating have a same pitch across the plurality of multi-layer gratings, a plurality of second line elements in each second grating have a same pitch across the plurality of multi-layer gratings, and wherein an offset between the first and second line elements is different across the plurality of multi-layer gratings.

6. The MEMS device of claim 1, wherein the resonator comprises a beam anchored to the support, wherein the first grating is formed in a bridging layer of the support that spans at least a transverse length of the beam, and wherein the second grating is formed in a top surface of the beam.

7. The MEMS device of claim 1, wherein the substrate has a bulk thickness and where the resonator also has at least the bulk thickness with faces of the resonator extending through the bulk thickness forming a plane substantially orthogonal to the plane of resonance, the faces of the resonator being separated from an opposing face of the support by a gap extending through the bulk thickness of the substrate.

8. The MEMS device of claim 7, wherein the bulk thickness is at least 500 µm, and wherein the pair of drive electrodes comprises first and second electrically independent anchors, with the first and second electrically independent anchors to conduct the alternating current to opposite ends of the resonator through the entire bulk thickness.

9. The MEMS device of claim 1, further comprising:
a light source disposed on a second substrate and having an emission wavelength to interrogate the multi-layer grating, wherein the emission wavelength is greater than a spacing of at least one of the first and second gratings; and
an optical detector disposed on the second substrate or a third substrate to measure an intensity of zeroth-order light modulated by the multi-layer grating.

10. A MEMS magnetometer, comprising:
a support including a substrate;
a beam resonator suspended from the support at two anchor points;
a first grating in a layer rigidly affixed to the support and spanning a transverse length of the beam resonator;
a pair of drive electrodes to apply an alternating current that induces the beam resonator to mechanically deflect in a plane parallel to the first grating as induced by the Lorentz force resulting from the alternating current in the presence of a magnetic field; and
a second grating on the beam resonator, wherein the first and second gratings overlap to form a multi-layer grating having apertures that vary dimensionally in response to the deflection.

11. The MEMS magnetometer of claim 10, wherein the multi-layer grating is one of a plurality of multi-layer gratings arrayed across a length of the beam resonator, ones of the multi-layer gratings being disposed at locations on the beam resonator that experience varying degrees of deflection induced by the Lorentz force to provide a wide dynamic range of sensitivity to the magnetic field.

12. The MEMS magnetometer of claim 11, further comprising:
a plurality of light sources to interrogate the plurality of multi-layer gratings, each having an emission wavelength that is greater than a regular spacing in at least one of the first and second gratings of the interrogated multi-layer grating; and
a plurality of optical detectors to measure an intensity of zeroth-order light modulated by each multi-layer grating interrogated.

13. The MEMS magnetometer of claim 12, wherein the light sources comprise a first light source to interrogate a first multi-layer grating at point of maximum deflection, and wherein the optical detector comprises a first optical detector to measure light from the first light source as modulated by the first multi-layer grating in response to the dimensional change of the apertures.

14. The MEMS magnetometer of claim 11, wherein the plurality of multi-layer gratings are symmetrically disposed in pairs equidistant from a center of a longitudinal length of the beam resonator to have multi-layer grating pairs disposed over points of equivalent deflection.

15. The MEMS magnetometer of claim 14, wherein substrate has a bulk thickness, wherein the resonator also has at least the bulk thickness, and wherein the drive electrodes impart the alternating current to the resonator through the entire bulk thickness.

16. A method of sensing a magnetic field, the method comprising:
applying an alternating current to a deflectable resonator of a MEMS magnetometer disposed in a magnetic field, the alternating current corresponding to a mechanical resonant frequency of the resonator;
interrogating a multi-layer grating of the MEMS magnetometer with light, the multi-layer grating comprising a first grating disposed on the resonator and a second grating overlapping the first grating and affixed to a support from which the resonator is suspended, the light having a wavelength that is greater than a spacing of at least one of the first and second gratings; and
determining an intensity of the light, as modulated by the multi-layer grating in proportion to mechanical resonator deformation induced by the Lorentz force resulting from the alternating current conducted through the resonator in the presence of the magnetic field.

17. The method of claim 16, wherein interrogating the multi-layer grating with light further comprises:
interrogating a first multi-layer grating with the light; and
interrogating a second multi-layer grating with the light.

18. The method of claim 17, wherein placing the MEMS magnetometer in a magnetic field further comprises:
determining an intensity of the light, as modulated by the first multi-layer grating proximate to a point of smallest deflection;
determining an intensity of the light, as modulated by the second multi-layer proximate to a point of greater deflection; and
selecting the first or second multi-layer having the modulation of light intensity satisfying a predetermined threshold criteria.

19. The method of claim 17, wherein determining the intensity of the light further comprises:

determining an intensity of the light, as modulated by the first multi-layer grating comprising first and second gratings having a first alignment relative to each other defining a first multi-layer grating phase;

determining an intensity of the light, as modulated by the second multi-layer grating comprising first and second gratings having a second alignment relative to each other, defining a second multi-layer grating phase different than the first; and selecting the first or second multi-layer grating having the a modulation of light intensity satisfying a predetermined threshold criteria.

20. The method of claim 16, wherein determining the intensity of the light further comprises detecting zeroth-order light reflected by the multi-layer grating.

* * * * *